United States Patent [19]
Felps

[11] Patent Number: 5,537,288
[45] Date of Patent: Jul. 16, 1996

[54] PTC SWITCH PROTECTED TERMINATION RESISTOR

[75] Inventor: Jimmie D. Felps, Colorado Springs, Colo.

[73] Assignee: Hewlett-Packard Company, Palo Alto, Calif.

[21] Appl. No.: 209,772

[22] Filed: Mar. 10, 1994

[51] Int. Cl.$^6$ .................................................. H02H 1/00
[52] U.S. Cl. ............................................ 361/124; 361/106
[58] Field of Search .............................. 338/20, 21, 22 R, 338/23, 24, 25; 361/27, 103, 106, 124; 330/143, 185, 191; 333/17.3, 22 R, 32, 33; 324/691, 713

[56] References Cited

U.S. PATENT DOCUMENTS

| | | | |
|---|---|---|---|
| 3,562,552 | 2/1971 | Baudino | 324/132 |
| 4,310,837 | 1/1982 | Kornrumpf et al. | 361/106 |
| 5,153,805 | 10/1992 | Tennant et al. | 361/106 |

OTHER PUBLICATIONS

Thermistors by E. D. Macklen, 1979, from Electrochemical Publications—see Chapters 9–12, and especially p. 164 No Month.

Primary Examiner—Jeffrey A. Gaffin
Assistant Examiner—Ronald W. Leja
Attorney, Agent, or Firm—Edward L. Miller

[57] ABSTRACT

The termination resistor of an electronic apparatus is connected in series with a thermistor PTC switch thermally coupled to the resistor. Excessive power dissipation in the resistor causes the PTC switch to trip, and the increased total resistance limits power dissipation in the resistor to safe levels. The PTC switch and the resistor may be merely in close physical proximity to one another to achieve the thermal coupling. Alternatively, the two may be fabricated as a unit assembly whose form factor is that of, or is similar to that of, the resistor that would otherwise be used by itself.

6 Claims, 4 Drawing Sheets

5,537,288

PTC SWITCH PROTECTED TERMINATION RESISTOR

BACKGROUND AND SUMMARY OF THE INVENTION

It is common for certain classes of test equipment to have input impedances determined by precision resistors located within the instrument, or piece of such test equipment. For example, a spectrum analyzer or network analyzer may have its input impedance determined principally by a fifty or seventy-five ohm termination resistance at the entrance of an attenuator shunting the input of an amplifier or mixer. Also, high frequency oscilloscopes often have fifty ohm inputs to properly terminate signals conducted to the instrument via transmission lines of fifty ohm characteristic impedance. In modern equipment of this type it is common for the termination resistance to be a physically small device that is part of a hybrid circuit fabricated upon a substrate. This means that the input termination resistor cannot be allowed to dissipate high power, and that the resistor might not be individually replaceable if it burns out, even if attempted at the factory level.

Even the lowly AC voltmeter sometimes is configured to present a specific resistive impedance of, say, six hundred ohms, to a source being measured. For specialized meters used exclusively in a particular environment the normally desirable high impedance of the input is shunted internally with a termination resistor, the better to cooperate with attenuators calibrated in db and designed for use in a system of a particular impedance. The issue in these instances is not so much the avoidance of the reflection of power, which is the case in the termination of coaxial or waveguide transmission lines, but the (low frequency) "voltage divider" properties of a load resistance upon the internal impedance of a source.

In many instances the input of such a voltmeter will be AC coupled, thus protecting the input from the accidental application of DC voltage that might burn out the termination resistor. However, it is still possible that high AC voltages (which are indeed available at low frequencies) could fry an input not intended for or protected against high voltages. Furthermore, if the meter is an RMS meter with a low input impedance, then it may not be AC coupled at all, making it additionally vulnerable to damage from high DC potentials.

Oscilloscopes and voltmeters that have high input resistances generally do not have a burn-out problem arising from excessive power dissipation; one or ten megohms simply doesn't carry enough current for the dissipated power to rise to dangerous levels for the voltage levels normally apt to be encountered. (Medium and very high voltage circuits and their components do have their own failure mechanisms, but overheating due to excessive power dissipation is not high on the list.) However, such oscilloscopes and voltmeters with high impedance inputs are frequently converted for use in fifty, seventy-five or six hundred ohm systems, through the use of a feed-through ("feed-thru") termination, which is nothing more than a shunt resistance (often located in a barrel connector) attached to the input terminals of the instrument. Clearly, the feed-through termination is vulnerable to accidental destruction. An operator can easily forget that it is there, and move the probe from a low level AC signal over to a power supply of say, twenty or thirty volts. By the time the operator realizes his mistake the termination resistor can be reduced to so much charcoal and a certain distinctive odor that lingers over the workbench. Even a two watt fifty ohm resistor dissipates rated power at a mere ten volts; at twenty volts it would be four times as much, or eight watts.

Fuses have sometimes been used to protect termination resistors of the sort we have been discussing. Fusing works in low frequency situations, although it is annoying to discover that a spare fuse is not at hand when needed. Fusing is generally an unfavorable solution for high frequency situations, owing to the disturbance it creates in the impedance of the system.

It would be desirable if a termination resistance, whether for high or low frequencies, and whether internal or feed-through, could be protected against accidental burn-out. This can be achieved by placing a temperature sensitive resistive device of positive temperature coefficient (PTC) in series with the termination resistor, and thermally coupling that PTC device to the termination resistor. The preferred PTC device is a type of thermistor called a "PTC switch" that has a very low resistance below a certain critical temperature (say, a few tenths of an ohm below about one hundred and twenty degrees centigrade) and a resistance several orders of magnitude greater above the critical temperature. The critical temperature may also be the same as, or be closely related to, or be dependent upon, the Curie temperature of the material of which the PTC switch is composed. By thermally coupling the two together, the temperature rise in the termination resistor that accompanies excessive power dissipation causes the PTC switch to "trip". The increased total resistance markedly reduces the power dissipation to safe levels, even for fairly high levels of applied voltage. The desired protection can be obtained by the simple expedient of mounting the termination resistor and the PTC switch in close physical proximity to one another. This not only helps reduce unwanted reactances in the interconnecting conductors, but allows adequate thermal coupling. A more sophisticated and general solution is to fabricate a unit assembly comprising the series combination of the termination resistor and the PTC switch. This allows much better control over stray reactances, convenient mounting and very close thermal coupling between the PTC switch and the resistor. The unit assembly can then be treated as if it were a "smart" termination resistor. The form factor of such a unit assembly could be unique, so as to be readily identifiable or to facilitate the fabrication thereof, or it could be chosen to match that of the resistor that would otherwise be used: surface mount unit assemblies would resemble surface mount resistors, pellet resistors could be replaced by pellet unit assemblies, and unit assemblies in axial lead packages would be usable in place of standard axial lead resistors.

The particular location within a circuit that such a PTC switch/resistor combination is deployed will depend upon the nature of that specific circuit, and how the surrounding components react to the application of high voltage and the subsequent increase in resistance of the protected resistor. In oscilloscopes, for example, the internal attenuator is commonly a high impedance compensated voltage divider, and the preamplifier connected thereto is built to withstand the application of high voltages, even in the most sensitive settings of the attenuator. In these cases the fifty ohm termination is a switchable resistance placed between ground and the input to the compensated attenuator. Since the protected termination resistor is in parallel with the rest of the input circuitry, raising the resistance of that termination resistor does not prevent the applied high voltage from reaching further into the circuit. In this setting the fifty ohm termination is the only part needing protection, and the preamplifier is not harmed by continuing to allow the high voltage to reach it. In other settings, such as constant impedance attenuators, the protected resistor may need to be placed in series so that it may additionally protect subsequent circuitry. Finally, feed-through terminations utilizing such protected resistors would be more robust, and less prone to accidental destruction.

DESCRIPTION OF A PREFERRED EMBODIMENT

Figure 1:
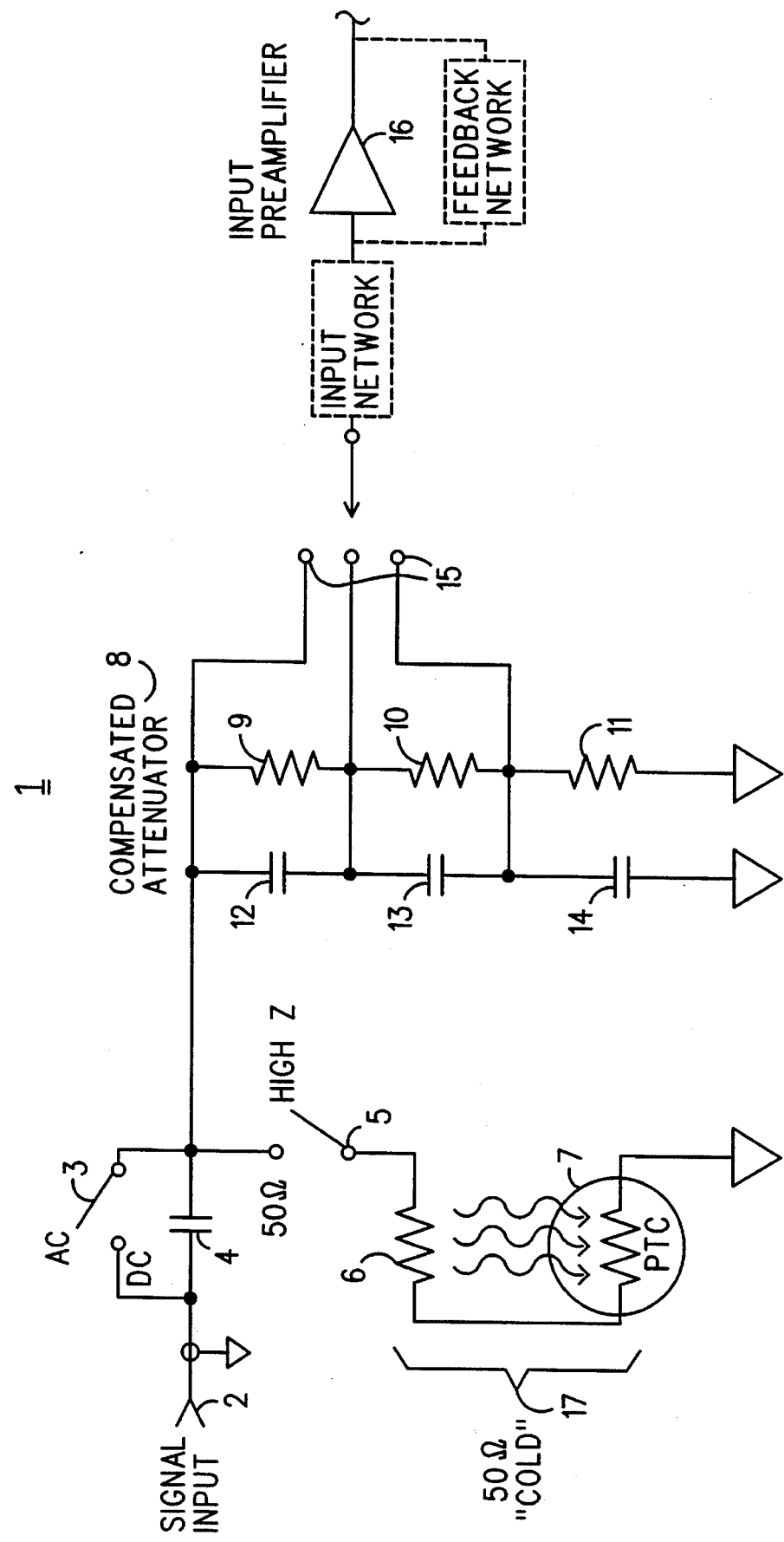
FIG. 1 is a simplified schematic of the input section of an electronic instrument, such as an oscilloscope, having a termination resistor protected against excessive power dissipation.

Refer now to FIG. 1, wherein is shown a simplified schematic 1 for an input portion of a preamplifier useable with an oscilloscope or other type of electronic test equipment. A connector 2 receives an input signal (not shown). A switch 3 determines whether or not the input signal is DC or AC coupled, by shorting or not shorting a series input capacitor 4. Another switch 5 determines whether the input impedance is the relatively high impedance (say, one megohm shunted by ten picofarads) presented by a compensated attenuator 8, or is fifty ohms (but as shunted by the high impedance compensated attenuator 8).

In the HIGH Z position switch 5 is open, so that the compensated attenuator 8 is not shunted by a termination resistance that matches the characteristic impedance of a transmission line connected to connector 2 and delivering the input signal. The compensated attenuator 8 is, for the sake of brevity, shown as having only three sections in series made up of the RC parallel combinations 9 with 12, 10 with 13, and 11 with 14. The output taps of the compensated attenuator 8 are applied to an input preamplifer 16 via a range selection switch 15. It will be understood that it is customary for the compensated attenuator to have a one-two-five (-ten) sequence over three or four decades, resulting in ten to thirteen switch positions, and also that there are other multi-pole switching configurations that are not simple linear "sticks", where the locations within the overall attenuator of entire sections are switched according to the decade desired. It is to be understood that the simple arrangement depicted in FIG. 1 is representative of all these other possibilities, and that these other possibilities are compatible with the input protection shown for the termination resistance.

When switch 5 is closed the compensated attenuator 8 is shunted by a termination resistance 17 that in the present example is fifty ohms. It will of course be understood that the termination resistance could also be seventy-two ohms, seventy-five ohms, or six hundred ohms. The termination resistance 17 is made up of the series combination of a resistor 6 and a PTC (Positive Temperature Coefficient) thermistor 7, commonly called a PTC switch. The resistor 6 and the PTC switch 7 are thermally coupled such that the temperature rise brought about by power dissipation in excess of the rating of the resistor 6 will cause the PTC switch to "trip", or undergo a very abrupt increase in resistance. The change is typically from a few tenths of an ohm to several hundred ohms. This increase in resistance limits the power dissipation in resistor 6 to safe levels by limiting the rise in the resistor's temperature.

It is important to keep in mind that in the instant example under consideration here it is the input termination resistor 6 that is being protected; not the input preamplifier 16. The input preamplifier 16 in the present example is an operational amplifier (op amp) whose (relatively high) input impedance is determined by an input network (shown as dotted lines) that is connected at one end to the output of the compensated attenuator 8 and that at the other end to a virtual ground established by a feedback network driven by the output of the input preamplifier. The active devices at or near the first stage of the input preamplifier 16 are protected in part by the high impedance of the input network and in part by the usual back-to-back diodes connected from the virtual ground (the "real" input) to ground.

As shown in FIG. 1, switch 5 follows switch 3, so that the termination resistance 17 may be either AC or DC coupled. In other situations it may be desirable for the termination resistance to be located right at the connector 2 and ahead of capacitor 4 and its switch 3. Under those circumstances the termination resistance 17 could have its own DC block (not shown).

Figure 2:
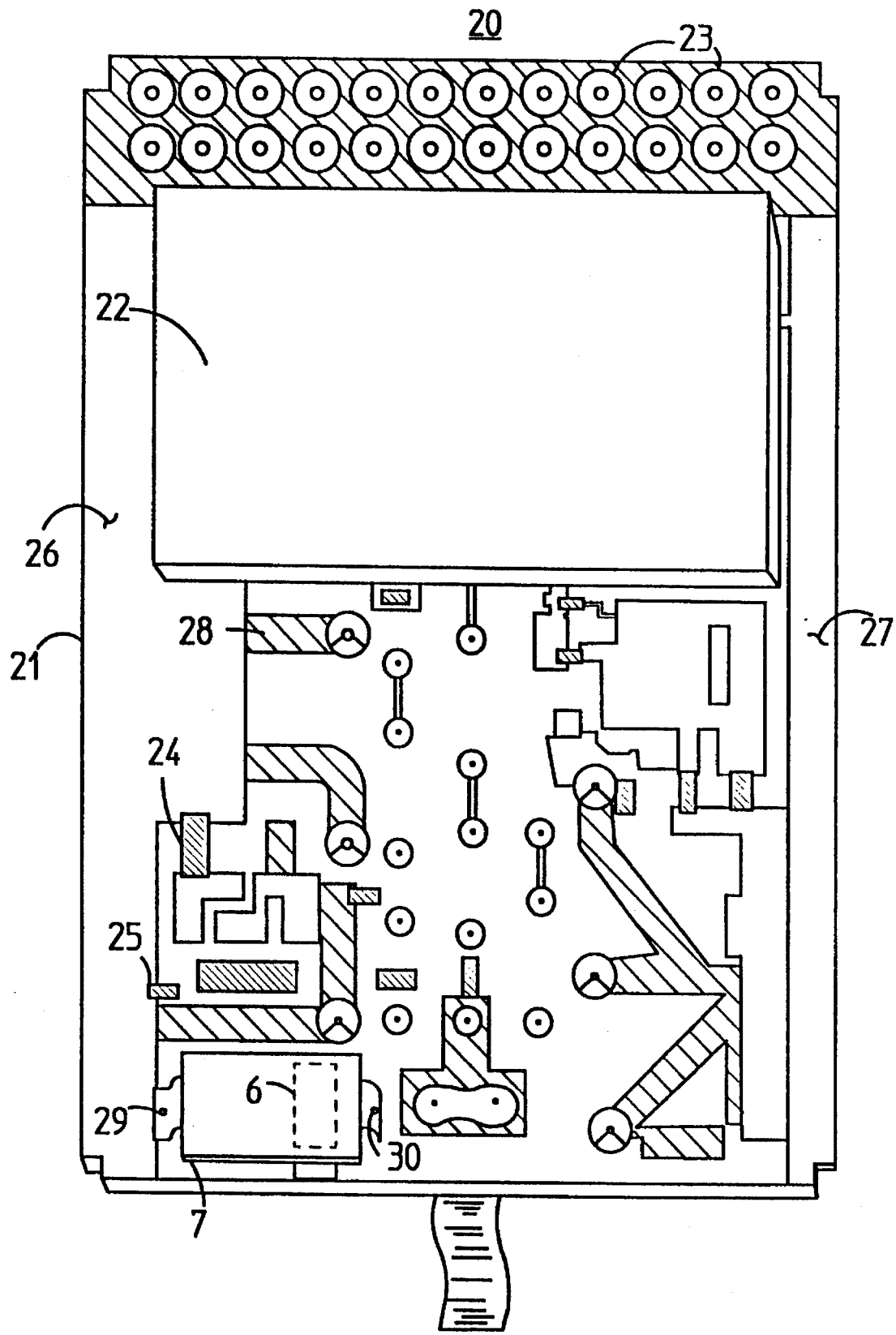
FIG. 2 is a simplified perspective view of a hybrid preamplifier assembly constructed in accordance with the schematic of FIG. 1.

Refer now to FIG. 2, wherein is shown a simplified perspective view of one side of a hybrid preamplifier assembly 20 incorporating thermal protection for a termination resistor, and corresponding generally to the circuit of FIG. 1. The hybrid preamplifier assembly 20 includes a ceramic substrate 21 approximately one and a quarter inches wide by two inches long by forty thousandths of an inch thick, and upon which a variety of other components are mounted. These other components include integrated circuit amplifier chips that are concealed under protective ceramic cover 22, and which are therefore not visible. Rows of connection pins 23 are registered in through holes and soldered; the usable portions of the connection pins extend outward from the reverse side of the ceramic substrate 21, and are thus not visible in the view of FIG. 2. The pins 23 mate with a socket attached to the oscilloscope that uses the preamplifier 20. Also mounted on the reverse side of the substrate 21 (and thus not visible) are three open frame latching relays whose function is to implement switch 15 of FIG. 1. Regions 26 and 27 (and others similarly depicted) are (uncovered) gold plated conductive traces. Diagonally shaded regions (such as 28) represent deposits of a dielectric material, which in the instant case is glass. The dielectric deposits may be used to separate different layers of gold traces or simply as a protective layer of insulation.

A number of other components are mounted on the ceramic substrate 21; these are represented by the various solid black rectangles, such as 24 and 25. These components are frequently resistors, which may be either surface mount parts or a screened-on paste of resistive material (thick film).

The resistor corresponding to termination resistor 6 in FIG. 1 is not directly visible in FIG. 2; it is covered by PTC thermistor switch 7. However, its location is indicated by the dotted line denoted as 6 in FIG. 2. PTC thermistor switch 7 is located directly above termination resistor 6; there is approximately 3/64" clearance between the top of resistor 6 and the underside of PTC thermistor switch 7. Resistor 6 is a half-watt resistor that is approximately fifty ohms; it is therefore limited to 5 VRMS. The proximity of PTC switch 7 to resistor 6 as described is adequate thermal coupling. For instance, if twenty volts DC is applied to the input of the preamplifier the PTC thermistor switch 7 switches within about thirty seconds at an ambient temperature of twenty-five degrees centigrade, which is adequate to protect the resistor 6 from damage. Heat flow from the resistor 6 to the PTC thermistor switch 7 is believed to be by conduction through the ceramic substrate to the leads of the PTC thermistor switch 7 (the screened-on thick film resistor 6 makes excellent thermal contact to the substrate), as well as by radiation from the exposed top of the resistor 6 to the underside of the PTC thermistor switch 7.

The particular PTC thermistor switch 7 used in the instant application is a PRP120 available from the Raychem Corporation of Menlo Park, Calif. The PRP120 is intended for use in place of a fuse in a battery supply; it has a current rating of fifty amperes and a voltage rating of fifteen volts. This voltage rating applies only when the PTC switch is potentially the only resistance limiting the flow of current; it does not apply when, as in the instant case, there is additional resistance in series with the PTC switch. This particular part was chosen because of its low untripped resistance of only a few tenths of an ohm, and its lead configuration of flat ribbons (29, 30) of a material compatible with conductive epoxy. For this particular application conductive epoxy was selected as the best method of attachment to an existing hybrid not originally intended to carry the PTC switch 7, and it will be understood that the best method of attachment in another application might be different, including soldering, spot welding, clamping, etc. The use of through holes in the substrate (or in a printed circuit board) and the use of a PTC switch with round wire leads thence soldered into the through holes is attractive. However, the heat of soldering can temporarily raise the low temperature resistance of the PTC switching thermistor from, say, a few tenths of an ohm to about double that. Repeated temperature cycling can generally reestablish the lower resistance, but at the expense of those additional steps during manufacture, plus the testing to verify it.

Figure 3A:
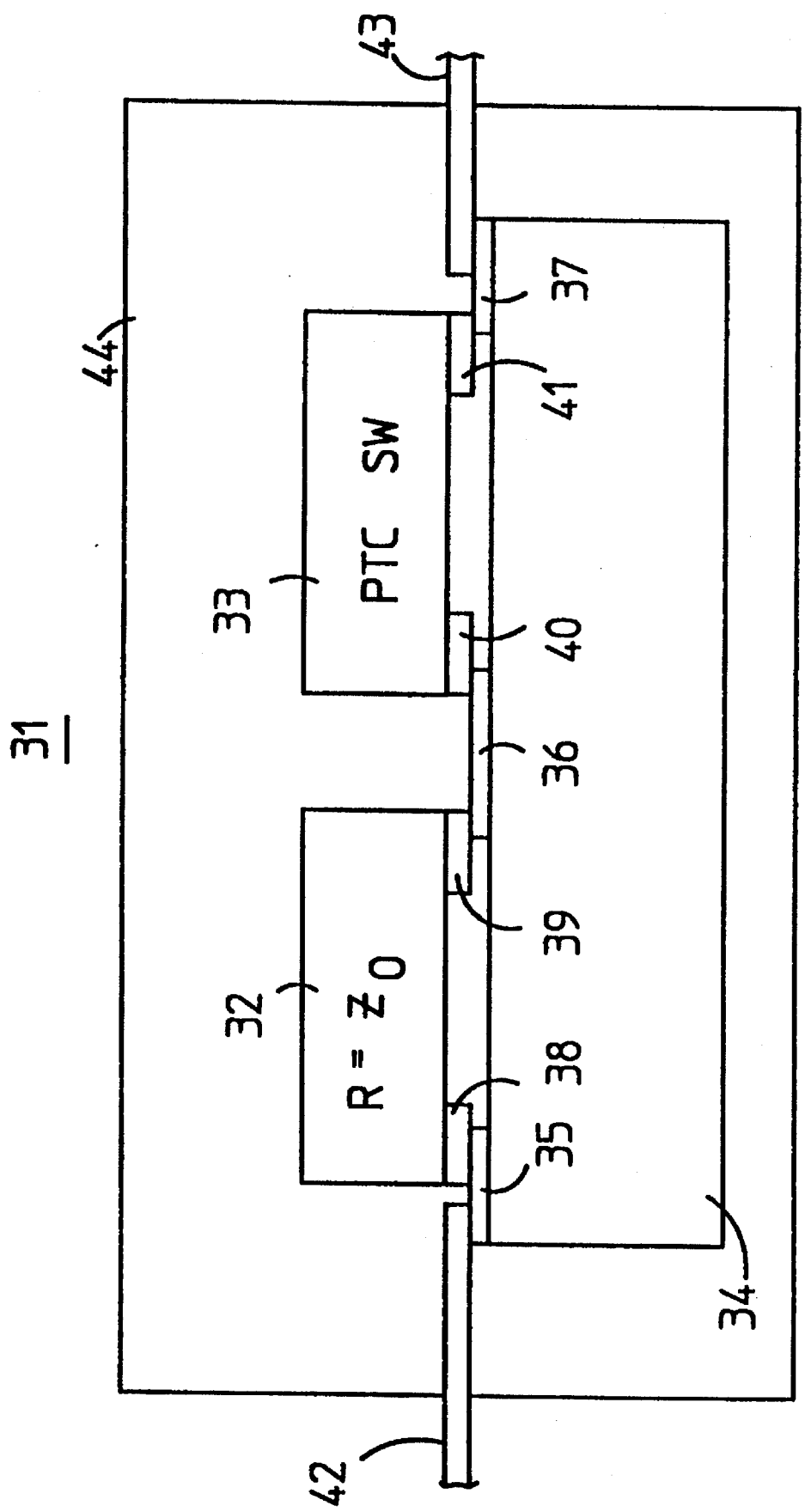
FIGS. 3A–B are simplified representations of a termination resistor assembly incorporating thermal protection obtained from a PTC thermistor switch electrically in series with the termination resistor and thermally coupled thereto.

It would be desirable if the thermally coupled combination of a termination resistor and PTC thermistor switch were combined into one two lead package that could be employed as if it were a robust self-protecting termination resistor. An assembly 31 of this type is shown in FIG. 3A, wherein a surface mount termination resistor 32 is in series with a surface mount PTC thermistor switch 33, and both are carried upon a substrate 34 having conductive pads 35–37 for connection to the corresponding mounting pads 38–41 of the resistor 32 and PTC thermistor switch 33. Leads 42 and 43 are bonded to pads 35 and 37, respectively. If desired, these leads could be of a material, such as Kovar, that does not easily conduct heat, as is used in transistor packaging. That would minimize the disturbance to the PTC switch caused by soldering the assembly into place. The entire assembly is encapsulated in a suitable material (e.g., PVC, epoxy) represented by reference character 44. Thermal coupling from the resistor 32 to the PTC thermistor switch 33 is through the substrate 34 and possibly through the encapsulating material 44.

Figure 3B:
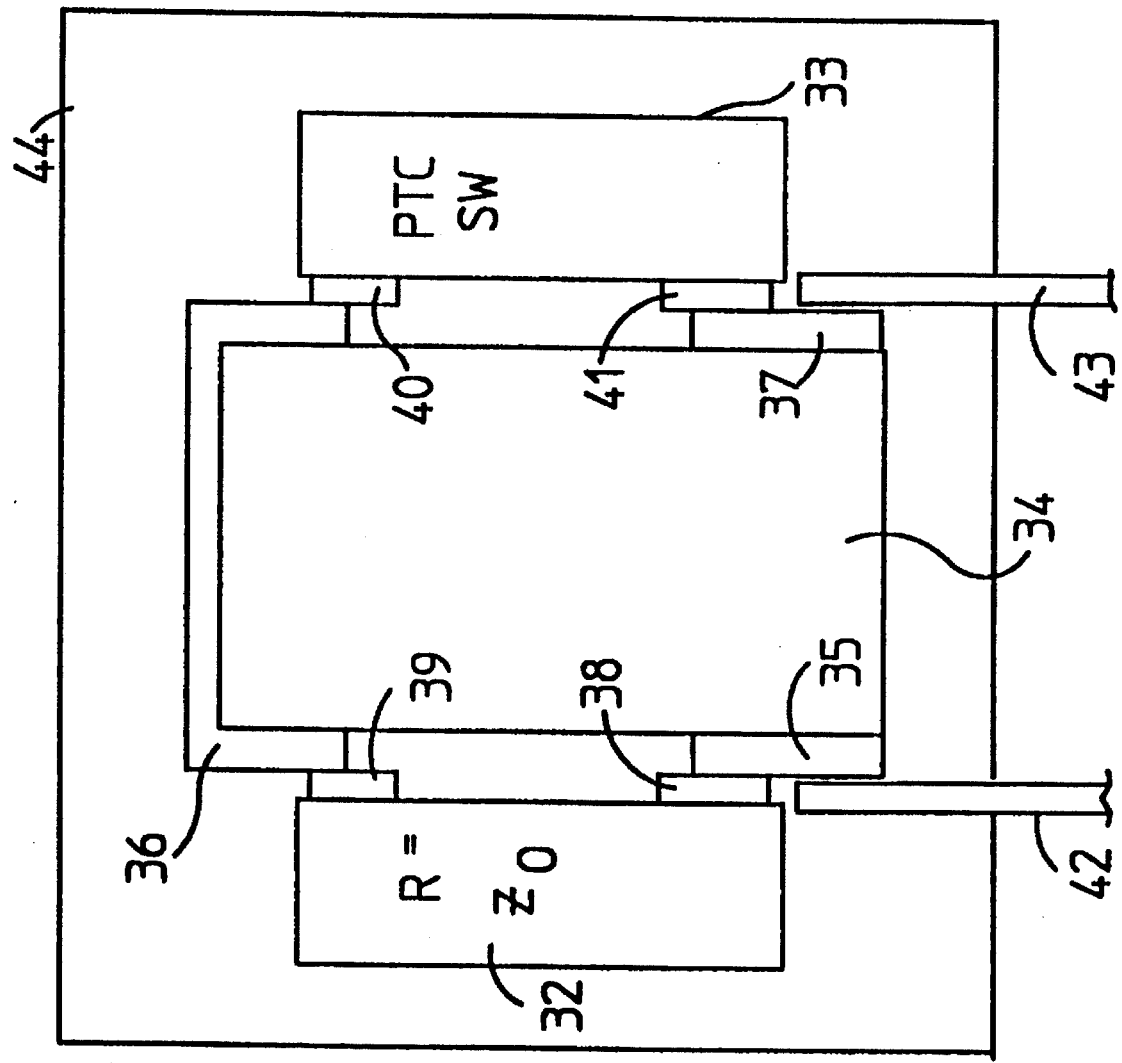

FIG. 3B illustrates a variation of the scheme of FIG. 3A that permits tighter thermal coupling. Like reference characters represent like elements between the two figures.

Those skilled in the fabrication of resistors and of PTC thermistor switches will appreciate that a variety of possibilities exist for combining those two devices into a single package, and that the best choices will depend heavily upon the compatibility of the different materials (e.g., chemical interaction and rates of thermal expansion) and the stray impedance considerations at the highest frequencies of intended operation, as well as overall form factor considerations imposed by the intended mounting site and intended method of electrical connection (e.g., soldering to leads or pressure against contact surfaces).

According to E. D. Macklen, writing in 1979 for his book *THERMISTORS*, published by Electrochemical Publications Limited, Ayr, Scotland, PTC switching thermistors are generally composed of barium titanate with some dopant (such as lead or strontium) in solid solution therein to fix (determine one out of a range of possibilities) the location or value of the Curie temperature. The conduction mechanism is apparently not ideally resistive in nature, requiring instead the tools of semiconductor physics to formulate theoretical explanations that can be tested against observation. One such theory mentioned in Macklen is the Heywang barrier-layer model. According to this model there are internal to the PTC thermistor material grains of material whose interfaces to one another act as non linear resistances shunted by capacitances. This leads Macklen to conclude at the bottom of page 164: "This frequency dependence limits the application of the resistance anomaly [i.e., the abrupt PTC effect] in barium titanate to frequencies below about 100K Hz." So says Macklen.

Nevertheless, the preamplifier assembly discussed above has a pass band of DC to about 700 MHz, intended for use in an oscilloscope of overall bandwidth to 500 MHz. It appears that the PTC switch 7 is effective well into the UHF range, e.g., at least to 300 MHz. That is, it not only protects the termination resistor from heating delivered from DC (accidental probing of a power supply), but also from heating delivered from large amplitude high frequency AC signals.

I claim:

1. A method of protecting a termination resistance for a transmission line against excessive power dissipation, comprising the steps of:

terminating a transmission line having a characteristic impedance with a series combination of a resistor of negligible temperature coefficient and a temperature sensitive resistance having a substantial positive temperature coefficient at a critical temperature significantly above an ambient temperature, the total resistance of the series combination approximating the characteristic impedance of the transmission line when the temperature sensitive resistance is at the ambient temperature;

thermally coupling the temperature sensitive resistance to the heat generated by power dissipated in the resistor;

increasing the resistance of the temperature sensitive resistance in accordance with power dissipated in the resistor; and limiting the power dissipated in the resistor in accordance with the increase in the total resistance of the series combination caused by the increase in temperature of the temperature sensitive resistance.

2. A method as in claim 1 wherein the temperature sensitive resistance is a PTC thermistor switch.

3. Amplification apparatus whose input resistance is for terminating a transmission line in its characteristic impedance, the amplification apparatus comprising:

a first resistance whose value is substantially equal to the characteristic impedance of the transmission line, of negligible temperature coefficient and electrically coupled at one end to the transmission line;

a second resistance having a substantial positive temperature coefficient when at a critical temperature above an ambient temperature, the second resistance in series with the first resistance, thermally coupled thereto and electrically coupled at one end to a signal ground; and an amplifier having an input electrically coupled to the transmission line and referenced to the signal ground.

4. Amplification apparatus as in claim 3, wherein the amplifier includes a virtual ground at a junction between an input network electrically coupled at one end to the amplifier input and a feedback network electrically coupled at one end to an output of the amplifier.

5. Amplification apparatus as in claim 4 further comprising an attenuator that couples the input of the amplifier to the transmission line.

6. Amplification apparatus as in claim 5 wherein the second resistance comprises a PTC thermistor switch.

* * * * *